(12) United States Patent
BrightSky et al.

(10) Patent No.: US 9,941,004 B2
(45) Date of Patent: Apr. 10, 2018

(54) INTEGRATED ARMING SWITCH AND ARMING SWITCH ACTIVATION LAYER FOR SECURE MEMORY

(71) Applicant: International Business Machines Corporation, Armonk, NY (US)

(72) Inventors: Matthew J. BrightSky, Pound Ridge, NY (US); Cyril Cabral, Jr., Mahaopac, NY (US); Kenneth P. Rodbell, Sandy Hook, CT (US)

(73) Assignee: International Business Machines Corporation, Armonk, NY (US)

( * ) Notice: Subject to any disclaimer, the term of this patent is extended or adjusted under 35 U.S.C. 154(b) by 10 days.

(21) Appl. No.: 14/984,426

(22) Filed: Dec. 30, 2015

(65) Prior Publication Data
US 2017/0229173 A1    Aug. 10, 2017

(51) Int. Cl.
*G11C 11/00* (2006.01)
*G11C 13/00* (2006.01)
*H01L 45/00* (2006.01)

(52) U.S. Cl.
CPC ...... *G11C 13/0059* (2013.01); *G11C 13/0004* (2013.01); *H01L 45/06* (2013.01); *H01L 45/144* (2013.01)

(58) Field of Classification Search
CPC . G11C 13/0069; G11C 13/0004; H01L 45/06; H01L 45/144
USPC .................................................. 365/163, 148
See application file for complete search history.

(56) References Cited

U.S. PATENT DOCUMENTS

| | | |
|---|---|---|
| 6,072,328 A | 6/2000 | Takuma |
| 7,295,455 B2 | 11/2007 | Okuda |
| 7,368,935 B2 | 5/2008 | Bernier et al. |
| 7,535,744 B2 | 5/2009 | Okuda |
| 7,675,066 B1 | 3/2010 | Dougherty et al. |
| 7,936,603 B2 | 5/2011 | Merry, Jr. et al. |

(Continued)

OTHER PUBLICATIONS

Chen et al., "The fabrication of a programmable via using phase-change material in CMOS-compatible technology", Nanotechnology 21 (2010) 134001 (5pp), 2010 IOP Publishing Ltd., Mar. 9, 2010.

(Continued)

*Primary Examiner* — Huan Hoang
(74) *Attorney, Agent, or Firm* — Scully, Scott, Murphy & Presser, P.C.; Keivan E. Razavi (57) ABSTRACT

An arming switch structure and method of operation. The arming switch is integrated with a reactive material erasure device and phase change memory cell array and is coupled to a tamper detection device configured to trigger a signal for conduction to the reactive material erasure device that generates heat and induces a phase change in the phase change memory cell array. Prior to packaging, the memory chip is "armed" in a high-resistance state to prevent conduction of any signal to the reactive material erasure device. After the memory chip is packaged, the Reactive Material can be "disarmed" at a chosen time or condition by applying a bias to the arming switch activation layer, thereby heating and crystallizing the arming switch material, placing it in a low resistance state. In the disarmed state, the arming switch may conduct the trigger signal from tamper detection device to the reactive material erasure device.

19 Claims, 5 Drawing Sheets

(56) References Cited

U.S. PATENT DOCUMENTS

| | | |
|---|---|---|
| 7,982,488 B2 | 7/2011 | Nirschl et al. |
| 8,105,859 B2 | 1/2012 | Breitwisch et al. |
| 8,581,617 B2 | 11/2013 | Reese et al. |
| 8,816,717 B2 | 8/2014 | Fritz et al. |
| 8,860,176 B2 | 10/2014 | Fritz et al. |
| 8,861,728 B2 | 10/2014 | Chu et al. |
| 8,925,098 B2 | 12/2014 | Hyde et al. |
| 2001/0002297 A1 | 5/2001 | Schweizer et al. |
| 2004/0199931 A1 | 10/2004 | Kumar et al. |
| 2008/0071783 A1 | 3/2008 | Langmead et al. |
| 2010/0192024 A1 | 7/2010 | Middleton et al. |
| 2011/0226148 A1 | 9/2011 | Sawka |
| 2012/0093318 A1 | 4/2012 | Obukhov et al. |
| 2013/0223173 A1 | 8/2013 | Higashi et al. |
| 2014/0230885 A1 | 8/2014 | Fyson et al. |
| 2016/0359635 A1 | 12/2016 | Kreft |
| 2017/0092694 A1* | 3/2017 | Brightsky ............ H01L 27/2463 |
| 2017/0117465 A1* | 4/2017 | Chang .................... H01L 45/08 |

OTHER PUBLICATIONS

Fisher et al., "A survey of combustible metals, thermites, and intermetallics for pyrotechic applications", SAND95-2448C, 32nd AIAA/ASME/SAE/ASEE Joint Propulsion Conference, Lake Buena Vista, FL, Jul. 1-3, 1996, pp. 1-13.
List of IBM Patents or Patent Applications Treated as Related.
Notice of Allowance dated Aug. 11, 2017, received in a related U.S. Appl. No. 14/871,030.

* cited by examiner

INTEGRATED ARMING SWITCH AND ARMING SWITCH ACTIVATION LAYER FOR SECURE MEMORY

STATEMENT OF GOVERNMENT RIGHTS

This invention was made with Government support under Contract No.: N00014-12-C-0472 awarded by the Office of Navy Research. The Government has certain rights in this invention.

FIELD

The present disclosure relates to phase change memory cells, and more particularly to an activation switch structure and method to build an arming switch structure for integration with a reactive material erasure element and the phase change memory cells.

BACKGROUND

Phase change memory (PCM) is a non-volatile solid-state memory technology that utilizes phase change materials having different electrical properties in their crystalline and amorphous phases. Specifically, the amorphous phase has a higher resistance than the crystalline phase. PCM cells are often programmed using heat generated by an electrical current to control the state of phase change materials.

PCM cells retain data stored therein even when electrical power fails or is turned off, which makes PCM cells vulnerable to tampering/attacks. Reactive materials (RM) which can generate heat through a spontaneously exothermic reaction have been explored as erasure elements in an integrated circuit containing PCM cells. The heat generated from the reaction of the reactive material can be used to induce phase transformation of the phase change material if sufficient heat can be directed to the PCM cells when tampering occurs, thus erasing the data stored in the PCM cells. Employing the reactive material as erasure elements is attractive since after erasure, there is no way to reverse engineer the bits in the PCM cells, while the remaining portion of the integrated circuit remains intact. Therefore, there remains a need to develop a method for integrating PCM cells and RM erasure elements that allows effectively triggering the erasure of the PCM cells.

SUMMARY

An Arming Switch structure and method of manufacturing and arming switch for use in a device such as a phase change memory system. The arming switch includes an arming switch activation layer for a phase change memory cell. In particular, the arming switch and an arming switch activation layer is integrated with a reactive material erasure device and phase change memory cell. The arming switch activation layer is a heater which changes the resistance of the arming switch material. The arming switch activation layer could be a reactive material; it could also be a heater such as PolySilicon or tungsten (W).

In one embodiment, after the memory chip is packaged, the arming switch can be "disarmed" at a chosen time or condition by applying a bias current to the arming switch activation layer, thereby heating the layer and responsively causing a crystallizing of the arming switch material, thus placing it in a low resistance state.

In accordance with one aspect, there is provided a semiconductor device. The device comprises a first layer of material responsive to a thermal condition for changing an electrical resistance property thereof; a second layer of material configured to receive a signal applied for generating the thermal condition for changing the electrical resistance property of the first layer material; and an insulator material layer formed between the first and second layers, the first material layer configured to switch from a first high resistance state to a second low resistive state responsive to the applied signal.

In another embodiment, there is provided a memory device. The memory device comprises: an array of phase change memory (PCM) cells arranged in rows and columns, wherein each of the PCM cells comprises a phase change material element; and a reactive material (RM) erasure element, wherein the RM erasure element is disposed between a pair of adjacent columns of the PCM cells in proximity therewith; a tamper detection device responsive to one or more conditions for generating a trigger signal for receipt at the reactive material erasure element; and a semiconductor arming switch device, the arming switch device electrically coupling the tamper detection device to the reactive material erasure element.

In another embodiment, there is provided a method of operating a integrated circuit having an array of phase change memory (PCM) cells arranged in rows and columns, wherein each of the PCM cells comprises a phase change material element, and having a reactive material (RM) erasure element, wherein the RM erasure element is disposed between a pair of adjacent columns of the PCM cells in proximity therewith. The method comprises: preventing, during manufacture of said integrated circuit, a signal to be conducted via a semiconductor arming switch device connected to the RM erasure element, the arming switch device disposed to electrically couple a tamper detection device to said reactive material erasure element, said arming switch device comprising: a first layer of material responsive to conditions for changing an electrical resistance property thereof; a second layer of material configured to receive a signal applied for changing the electrical resistance property of the first layer material; and an insulator material layer formed between said first and second layers, said first material layer configured to switch from a first high resistance state to a second low resistive state responsive to said applied signal. The method further comprises: subsequent to completing packaging of said integrated circuit (IC), applying, from a signal source external to the IC, a signal through a conductive path connecting the second layer of material at a first location, and connecting the second layer of material at a second location, wherein the applying renders the first layer of material of the arming switch device in a state configured for conducting a signal from the tamper detection device directly to the reactive material erasure element.

BRIEF DESCRIPTION OF THE DRAWINGS

Various objects, features and advantages of the present invention will become apparent to one skilled in the art, in view of the following detailed description taken in combination with the attached drawings, in which.

DETAILED DESCRIPTION

The present application will now be described in greater detail by referring to the following discussion and accompanying drawings. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Co-pending U.S. patent application Ser. No. 14/871,030 entitled INTEGRATED REACTIVE MATERIAL ERASURE ELEMENT WITH PHASE CHANGE MEMORY, the contents and disclosure of which is incorporated by reference as if fully set forth herein, teaches a method for integrating a reactive material (RM) erasure element with PCM cells. A reactive material erasure element comprises a reactive material located between PCM cells and is in close proximity to the PCM cells. The reaction of the reactive material is triggered by a current applied by a first (e.g., bottom) electrode which has a small contact area with the reactive material erasure element, thereby providing a high current density in the reactive material erasure element to ignite the reaction of the reactive material. Due to the close proximity of the PCM cells and the reactive material erasure element, the heat generated from the reaction of the reactive material can be effectively directed to the PCM cells to cause phase transformation of phase change material elements in the PCM cells, which in turn erases data stored in the PCM cells.

Figure 1:
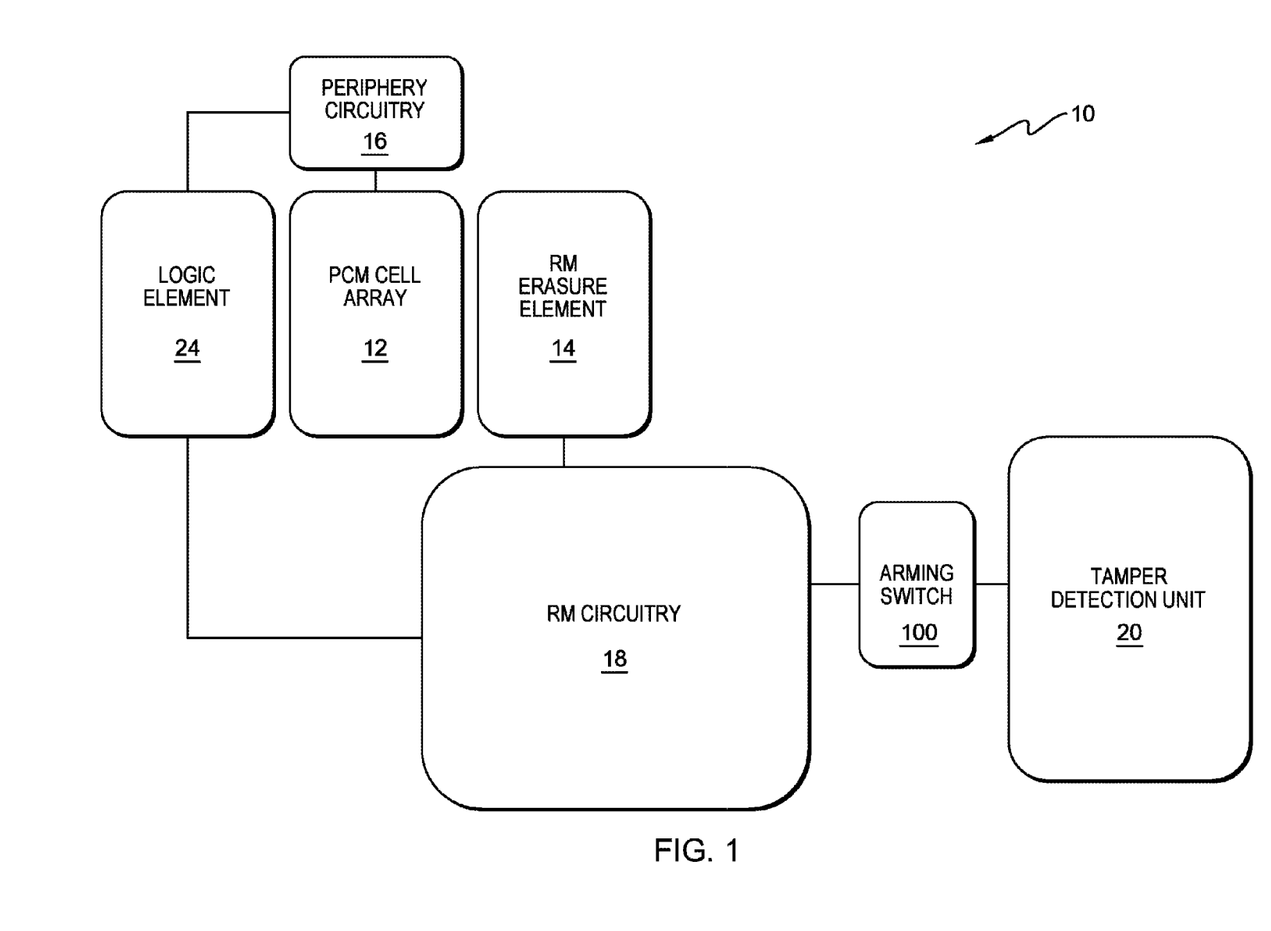
FIG. 1 depicts a block diagram of a memory system integrated within an integrated circuit incorporating the arming switch device for connection to a tamper detection device according to an embodiment.

FIG. 1 is a block diagram of an integrated circuit 10 according to an embodiment described in herein incorporated co-pending U.S. patent application Ser. No. 14/871,030. The integrated circuit 10 includes a PCM cell array 12 for storing information, and a RM erasure element 14. A periphery circuitry 16 is electrically coupled to the PCM cell array 12 and is configured to apply appropriate voltages to PCM cell array 12 for write and read purposes. A RM circuitry 18 is electrically coupled to the RM erasure element 14 and is configured to control the amplitude of the current so that sufficient current can flow through the RM erasure element 14 to trigger the exothermic reaction of the reactive material in the RM erasure element 14. A tamper detection unit 20 is electrically coupled to the RM circuitry 18 to generate an erase signal in response to the existence of one or several erase demand scenarios. The tamper detection unit 20 may include photovoltaic cells, x-ray detectors or shock detectors.

An arming switch 100 according to the embodiments described herein, is connected in an electrical path between an output terminal of the tamper detection unit 20 and an input terminal of the RM circuitry 18 and is "armed" to prevent a flow of current until a deactivation or disarming signal is received to place it in a low resistance state. Thus in the "armed" state it is of high resistance and allows little current to flow and in the "disarmed" state it is of low resistance and allows enough current to flow to trigger the reactive material.

A logic element 24 (e.g., a processor or control device) is electrically coupled to the PCM periphery circuitry 16 and the RM circuitry 18 and is configured to perform an algorithm to determine a condition(s) for triggering the reaction of the reactive material based on a multitude of inputs including inputs related to date and time, inputs related to environment such as, for example, temperature, humidity, pressure and precipitation, inputs related transportation such as, for example, altitude, velocity, acceleration and direction and inputs related to the electromagnetic spectra such as, for example, visible light, infrared light and x-rays.

In further embodiments, arming switch 100 may be embedded for direct path electrical connection between the tamper detection unit 20 and the RM erasure element 14.

Figure 2A:
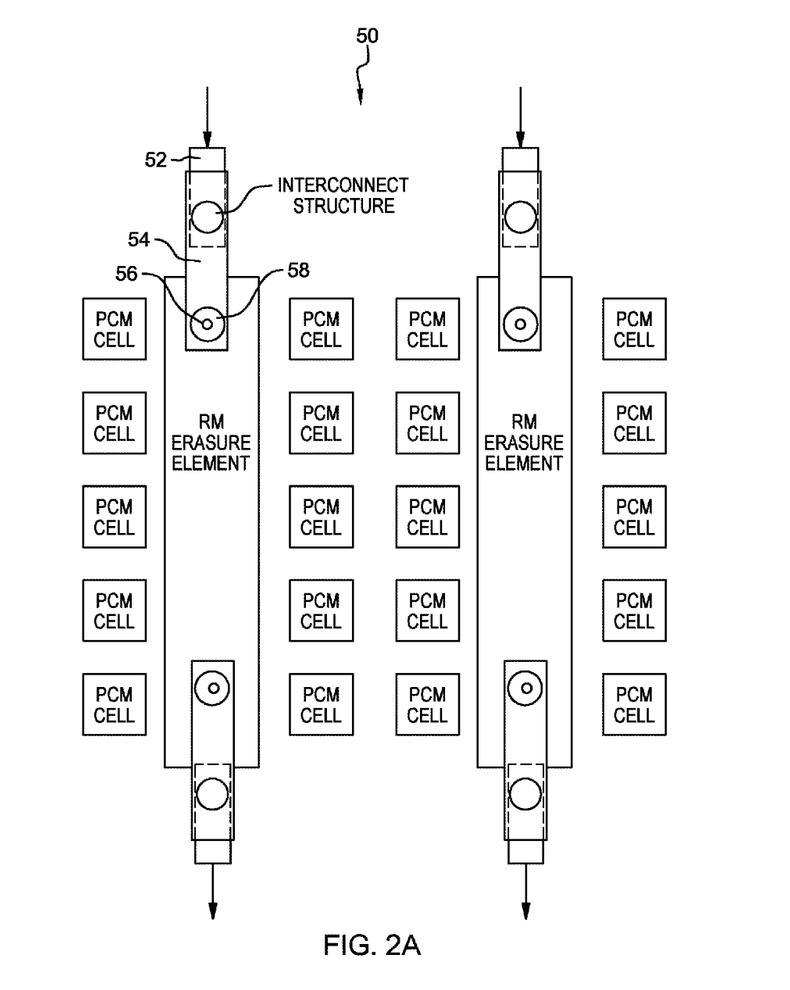
FIG. 2A depicts a top layout view of the PCM cell array and circuitry illustrating a first wiring scheme of RM erasure elements in which an arming switch device is to be incorporated for connection to a tamper detection device according to an embodiment.

In a first embodiment, FIG. 2A shows a top layout view 50 of the PCM cell array and circuitry illustrating a first wiring scheme of RM erasure elements. In the first embodiment, a plurality of strip-shaped RM erasure elements may be formed. Each of the RM erasure elements is arranged between a pair of adjacent columns of PCM cells in a PCM cell array and is electrically coupled to a voltage source through electrical contacts 52 located at opposite ends of each of the RM erasure elements. The electrical contacts 52 are in electrical communication with a further local interconnect structure 54, e.g., in a first metallization level of the formed integrated circuit. The interconnect structure 54 is electrically connected to a bottom electrode 56, e.g., through a bottom contact via structure 58. During erasure, current that flows into one end of each of the RM erasure elements and flows out the opposite end of each of the RM erasure elements causes a reaction of the reactive material which releases enough heat to crystallize and erase the state of each adjacent PCM cell.

Figure 2B:
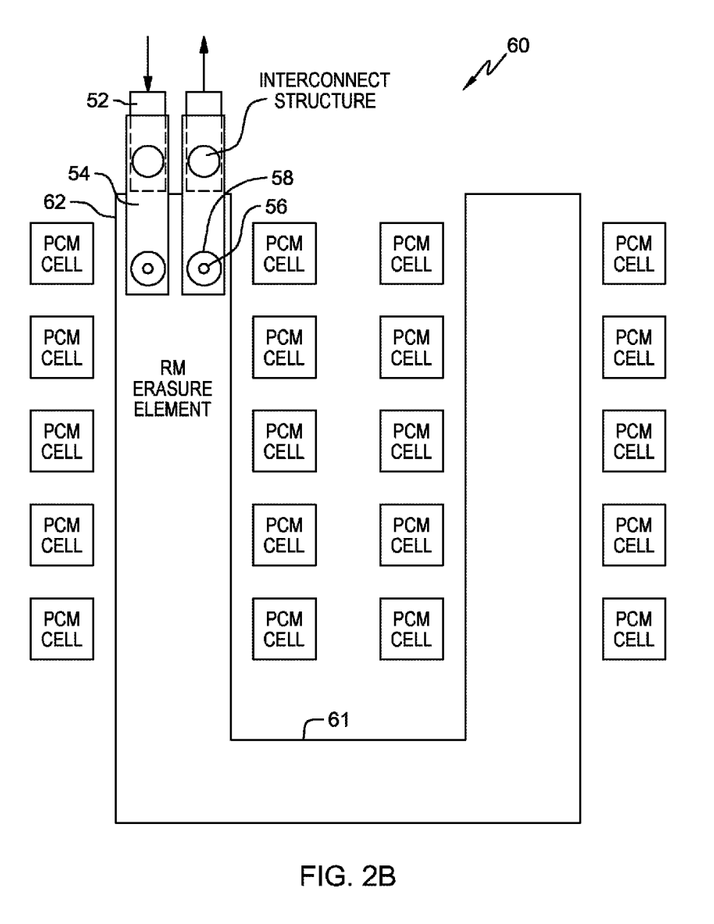
FIG. 2B depicts a top layout view of the RM erasure element shown as a contiguous layer having a serpentine configuration in which an arming switch device is to be incorporated is to be incorporated for connection to a tamper detection device according to an embodiment.

In a further embodiment, shown in FIG. 2B, the RM erasure element is a contiguous layer having a serpentine configuration such that parallel line portions of the RM erasure element are connected by a connecting segment 61. Each line portion of the RM erasure element is located between a pair of adjacent columns of PCM cells in an PCM cell array. The RM erasure element is electrically coupled to a voltage source (not shown) through electrical contacts located at one end 62 of the RM erasure element. During erasure, current that flows in and out of the RM erasure element through electrical contact formed at the same end causes a reaction of the reactive material which releases enough heat to crystallize and erase the state of each PCM cell. In the further embodiment, because the RM erasure element is electrically coupled to the electrical contacts located at the same end of the RM erasure element, the contact via structures need only to be present at a single place.

Figure 3:
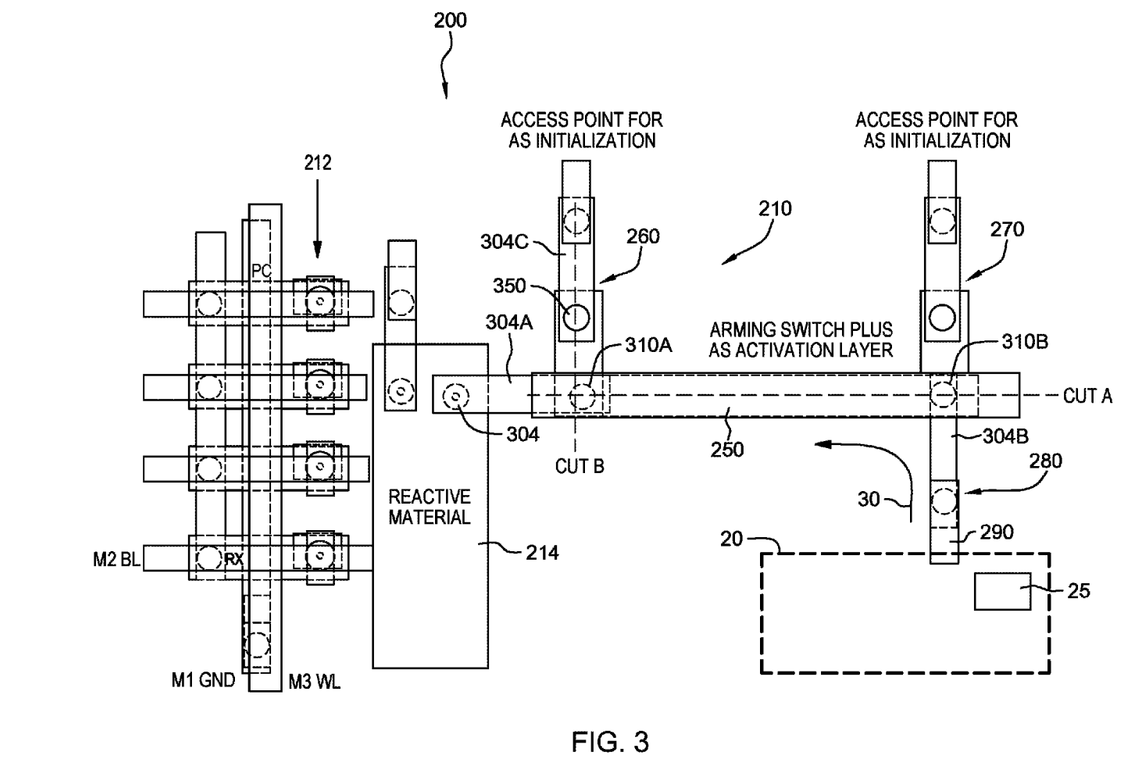
FIG. 3 shows a top down plan view of a PCM cell array and Arming Switch circuitry including an Arming Switch and an Arming Switch Activation Layer, integrated with the reactive material erasure element such as shown in the RM erasure element layouts shown in FIG. 2A or FIG. 2B.

FIG. 3 shows a top down plan view 200 of a PCM cell array 212 and Arming Switch circuitry 210 consisting of an Arming Switch and an Arming Switch Activation Layer 250, integrated with the Reactive Material Erasure Device 214 and the array 212 Phase Change Memory Cells. In one embodiment, the system of FIG. 3 may be implemented within the RM erasure element layouts shown in FIG. 2A or FIG. 2B.

In the circuitry 210, the Arming Switch and arming switch activation layer 250 is electrically coupled to the RM erasure element 214 through an interconnect structure including an electrical contact 304 and local conductor element 304A located at one end of the RM erasure element. In the embodiment shown, two contacts (not labeled in FIG. 3) to the RM erasure element 214 are shown at the same end, but the contact 304 connecting Arming Switch (AS) and an Arming Switch (AS) Activation Layer 250 may be connected at any location of the RM erasure element 214. In further embodiments, there may be multiple contacts at the RM erasure element at multiple locations that connect to the Arming Switch circuit for multiple trigger points.

As further shown in FIG. 3, arming switch circuitry 210 there is provided electrical contacts 260, 270, i.e., conductive structures, that connect to further respective conductor structures such as interlevel metal conductors (not shown) providing paths to receive a signal for arming or disarming the state of the arming switch 250. As shown, access point contact conductors 260 and 270 are spaced apart lengthwise at opposite locations of the switch 250. It is understood that the location of access conductors along the length of the arming switch 250 relative to each other will determine the resistance of the arming switch material. These access structures 260, 270 may be electrically connected to pins accessible at the integrated circuit (IC) package level to enable biasing of the arming switch with an applied power signal for arming/disarming the switch activation layer material. In the circuitry 210, further electrical contact and conductive structure 280 connects the AS/AS Layer 250 to an electrode or contact 290 at an output of the tamper detection unit 20. When triggered, the tamper detection unit will assert a signal, e.g., an electrical current or voltage signal 30, sufficiently conducted through the Arming switch 250 when disarmed, and cause a reaction of the reactive material which releases enough heat to crystallize and erase the state of each PCM cell of array 212.

Thus, although not shown, the terminals from the arming switch activation layer are accessible at the package level via the conductive access point structures 260, 270. Terminals are also provided from the arming switch go both to the reactive material (304A) and to the input for the trigger (304B).

The Arming Switch Activation Layer of Activation Switch element 250 is a heater which changes the resistance of the Arming Switch material, e.g., Ge, Si, GST material. Initially, the arming switch material is in an amorphous state, and highly resistive to prevent any current flow that may cause a reaction with the RM material during manufacture/packaging. After the memory chip is packaged, the Arming Switch Activation layer, e.g., the heater of W, TaN, TiN, MoSi material, can be "disarmed" at a chosen time or condition by applying a power signal across the Arming Switch Activation layer, e.g., via pins connecting access point conductive contacts 260, 270 thereby heating and crystallizing the Arming Switch material and bringing it into a lower resistance state. Once in the lower resistive state, switch 250 in low resistance crystalline form readily conducts a trigger signal current from a tamper detection circuit to cause an exothermic reaction and trigger the RM material.

In one embodiment, a criteria for the arming switch material 254 is a large multiple order of magnitude decrease in resistance, e.g., 3-4 orders of magnitude, typically from an amorphous to crystalline state, responsive to application of the heat. Materials such as Ge, Si, or a phase change material such as $Ge_xTe_{1-x}$ (e.g., x>0.6) and $Ge_xSb_yTe_z$ (germanium-antimony-tellurium, 0.2>x>0.5, 0.15>y>0.25, 0.3>z>0.6) may be used in one embodiment In one embodiment, such phase change materials may include, $Ge_xTe_{1-x}$, $Ge_{75}Te_{25}$, $Ge_{85}Te_{15}$, $Ge_4Sb_2Te_3$, GST (40% Si). For example, a small 100 nm thick layer of Ge that is Boron doped (e.g., to a concentration of $2\times10^{15}$) provides about 4 orders of magnitude change of resistance, e.g., from about 4.68 MOhms to about 150 Ohms.

In another embodiment, a criteria for the arming switch activation layer 252 is that it be both fairly resistive and have a high melting point, such that it can produce adequate joule heating upon current flow. The purpose of activation layer 252 is to heat the arming switch layer material 254 to induce crystallization. Possible material choices are W, TaN, TiN, Ni—Cr alloys, Fe—Cr—Al alloys, Cu—Ni alloys, MoSi2 and PCT ceramics. In one embodiment, the melting point of the arming switch activation layer material is greater than 2000° C. and its resistivity is greater than 10 mΩ-cm.

Figure 4A:
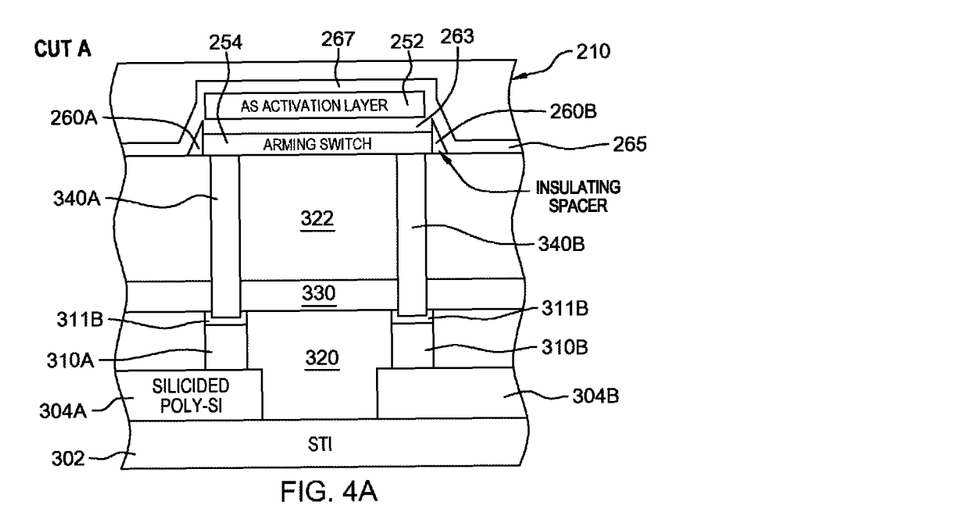
FIG. 4A shows a cross-sectional lengthwise view of the Arming Switch (AS) and AS Layer structure taken along "Cut A" of circuit shown in FIG. 3.

FIG. 4A shows a cross-sectional lengthwise view (not to scale) of the Arming Switch (AS) and AS Layer structure 250 taken along "Cut A" of circuit 210 shown in FIG. 3. Arming switch element 250 is a structure having an Arming Switch material layer 254 of semiconductive material, e.g., Ge, Si, or a phase change material, and an Arming Switch activation layer 252 overlying the arming switch material that comprises a heater element of a metal material, e.g., Tungsten. When arming switch circuitry 210 is placed in an activated state, the arming switch activation material layer 252 is heated which places the arming switch material layer 254 in a low resistance state for conducting enough current from a tamper detection device (e.g., a photovoltaic cell) to the RM material to cause an exothermic reaction thereat and erase phase change memory content at the PCM cells. The temperature required to arm the switch element by placing it in a decreased resistance state must be higher than the temperature used in the typical processing for manufacturing the IC, e.g., BEOL processes for forming metal level interconnects, that the circuit may be subject too.

As shown in cross-sectional elevational view of FIG. 4A, the building of the arming switch circuit 210 is performed in step with building of the phase change memory cell array and reactive material erasure devices such as described in detail in herein incorporated U.S. patent application Ser. No. 14/871,030. In the embodiment shown in the view of FIG. 4A, using known semiconductor processing and lithography steps, the arming switch 250 is built upon an insulative layer, e.g., an oxide such as a formed buried oxide layer (BOX) substrate structure, or built on top a shallow trench isolation layer (STI) such as STI layer structure 302 embedded in a semiconductor substrate in order to isolate adjacent access transistors (not shown).

Formed on top of the STI layer 302 on a semiconductor substrate is an interlevel dielectric layer (ILD) 320 formed typically of a low-k dielectric material such as, for example, silicon oxide, organosilicate glass or borophophosilicate glass. The ILD layer 320 can be formed by utilizing a deposition process such as, for example, chemical vapor deposition (CVD), physical vapor deposition (PVD) or spin-on coating.

Portions of the ILD layer are removed and lithographic semiconductor manufacturing processes are implemented to form respective conductive structures 304A, 304B directly over the STI layer 302 and located at opposite ends of the arming switch 250. These bottom conductive poly-Si contact structures 304A, 304B provides respective electrical communication to front-end-of-line (FEOL) connections or devices, e.g., transistors (not shown). In one embodiment, a first structure, e.g., 304A, electrically connects with a respective contact to the RM material layer (not shown), while the other structure, e.g., 304B, electrically connects with a respective contact at an output of the tamper detection circuit, e.g., a sensor device(s) output, logic circuit or other trigger device.

Various bottom contact structures are then formed in the ILD layer 320 by forming contact openings (not shown) extending through the ILD layer 320 and filling the contact openings with a conductive material such as, for example, tungsten (W), titanium nitride (TiN) or copper (Cu). In some embodiments of the present application, before filling the contact openings with the conductive material, a contact liner (not shown) may be formed on exposed surfaces of each contact opening. In one embodiment, the contact liner includes TiN. In some embodiments of the present application and when the contact structures are formed of W, respective conductive caps 311A, 311B, e.g., of TiN material, may also be formed on top of the bottom contact structures 310A, 310B respectively, by recessing the conductive material deposited in the contact openings to provide voids and filling the voids with TiN. The bottom contact structures 310A, 310B extend through the ILD layer 20 and contact respective Silicided poly-Si regions 304A, 304B, respectively. As shown, contacts 310A, 310B are respectively formed at or near opposite ends of the arming switch device. It is understood that this distance between these contacts will determine the resistance of the arming switch.

Next, an insulator layer 330 is formed over the bottom contact structures 310A, 310B and the ILD layer 320. The insulator layer 330 may include a dielectric material such as silicon oxide, silicon nitride, silicon oxynitride, or a combination thereof. In one embodiment, the insulator layer 330 is composed of silicon nitride. The insulator layer 330 may be formed utilizing a deposition process such as, for example, CVD or PECVD. The insulator layer 330 that is formed may have a thickness ranging from 50 nm to 100 nm, although lesser and greater thicknesses can also be employed.

Then, formed on top of the insulator layer 330 is a further interlevel dielectric layer (ILD) 322, e.g., a low-k dielectric material such as, for example, silicon oxide, organosilicate glass or borophophosilicate glass. The ILD layer 322 can be formed by utilizing a deposition process such as, for example, chemical vapor deposition (CVD), physical vapor deposition (PVD) or spin-on coating.

Two spaced-apart interconnect conductive via structures 340A, 340B are then formed in the ILD layer 322 that extend through the insulating layer 330 to electrically contact respective contact structures 310A, 310B respectively. In one embodiment, contact openings (not shown) are formed to extend through the ILD layer 322 and through the insulating layer 330, and these contact openings are filled with a conductive material such as, for example, tungsten (W), titanium nitride (TiN) or copper (Cu). In some embodiments of the present application, before filling the contact openings with the conductive material, a contact liner (not shown) may be formed on exposed surfaces of each contact opening.

In one embodiment, each of the conductive via structures 340A, 340B provide a very small contact surface for concentrating current density during operation of the circuit. The resulted high current density allows effectively triggering the reaction of a reactive material in a RM erasure element later. The area of the top contact surface of each of the conductive vias can be from 100 $nm^2$ to 100000 $nm^2$, although lesser and greater areas can also be employed.

Then, the arming switch 250 is formed on the top of the IDL layer 322 in which upper surfaces of both conductive vias 340A, 340B are co-planar with the upper surface of the formed IDL layer 322 have been exposed. The arming switch 250 is formed, first by forming a layer of photoresist material above the IDL layer, patterning the material in the form of the resultant active switch structure, depositing a blanket semiconductor material, and then removing the photoresist in a lift-off process to result in the remaining patterned arming switch layer structure 254. The formed active switch layer 254 may range from between about 0.1 microns-1 micron in thickness and may comprise Ge, Si, or a phase change material, e.g., $Ge_xTe_y$. In one embodiment, the thickness of the active switch layer 254 may range from between 0.2 microns to about 0.5 microns. As shown, the arming switch layer structure 254 electrically contacts a top surface of each underlying conductive via 340A, 340B at opposite ends thereof.

Then, in one embodiment, using known semiconductor manufacturing techniques, a pair of insulating spacer elements 260A and 260B are formed at each of the side edges at opposite ends of the arming switch layer structure 254. In one embodiment, conventional semiconductor manufacturing processes are used in forming insulating spacers of a dielectric material such as a nitride, for example, SiN. Additional insulative spacer elements 261A, 261B may be formed along the lengthwise side edges of the arming switch material layer 252 during the same process steps as shown in the view taken along "Cut B" of FIG. 4B.

Returning to FIG. 4A, an insulative material layer 263 is then formed on top of the arming switch layer structure 254 covering the whole length of the arming switch 254 and covering the respective insulating spacers at each end and results in the forming of insulator layer 265 portions on either side of the switch 250 over ILD layer 322. Insulating layer portion 263,265 may include a dielectric material such as silicon oxide, silicon nitride, silicon oxynitride, or a combination thereof and may range in thickness from between about 10 nm-200 nm in thickness (although greater and lesser thicknesses may be implemented). Insulating layer 263 may also comprise a nitride barrier, e.g., SiN, and must be thick enough to prevent any reaction between the two material layers, and thin enough so that any heat generated by the overlying heater element 252 will directly transfer to the arming switch 254 to crystallize the arming switch material and decrease its resistance.

The values of resistance in an amorphous state must be such that a current density can not be forced through the arming switch to cause a reaction of the exothermic RM material. The values of the arming switch resistance in a crystallized state is such that a current density can be forced through the arming switch to cause a reaction of the exothermic RM material.

Then, the arming switch activation layer 252 is formed, first by forming and patterning a layer of photoresist material, depositing a layer of heater material, e.g., Tungsten, above the arming switch layer 254, and using a lift-off process for removing portions that result in the remaining arming switch activation layer structure 252. In one embodiment, the switch activation layer 252 is formed to length and width dimensions that correspond to or exceed the length and width dimensions of the underlying arming switch layer 254 to ensure uniform heating of the underlying amorphous material. The formed active switch activation layer structure 252 may range in thickness from between about 1000 Å (or 0.1 microns)-2.0 microns. This layer 252 may further range from between 0.5 micron in thickness to 1 micron in thickness and may comprise Tungsten or other heater material.

It should be understood that, alternate processes may be used to form arming switch layer structure 254 and switch activation layer structure 252. For example, a damascene process may be used where dielectric material is first deposited and reactive ion etched (RIE) to form the arming switch layer feature where the structure 252 is to be formed, and then this feature is filled with Ge material fill, and a chemical mechanical polish (CMP) step is used to planarize to the filled structure, e.g., to form the switch activation layer structure 252. Similar damascene process may be used to form the overlying arming switch layer structure 254.

Finally, on top insulating layer portion 267 is formed over the whole length of the formed switch structure 250 defining a stack including: arming switch layer 254 and the side insulating spacers 260A, 260B, the dielectric material layer 263 and the Activation layer structure 252. In one embodiment, overlying dielectric material 267 such as silicon oxide, silicon nitride, silicon oxynitride, or a combination thereof and may range in thickness from between about 10 nm-200 nm in thickness.

In one embodiment, further interlevel dielectric layer may be formed on top the arming switch 250, with further connections in the form of metal layers to back end of line structures, and eventually, to connections outside the chip.

Figure 4B:
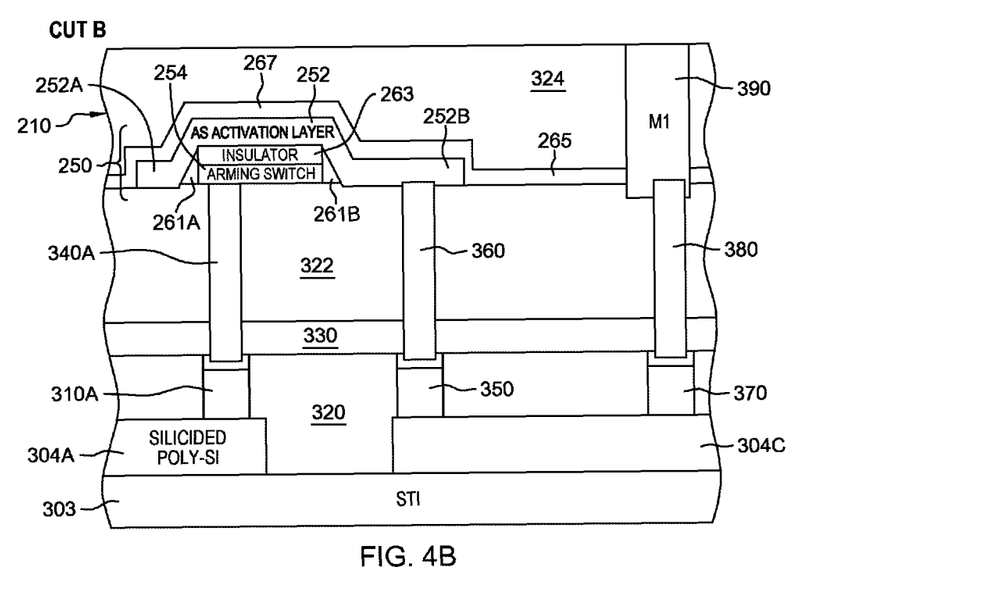
FIG. 4B shows a cross-sectional lengthwise view of the Arming Switch (AS) and AS Layer structure taken along "Cut B" of circuit shown in FIG. 3.

FIG. 4B shows a cross-sectional lengthwise view (not to scale) of the Arming Switch (AS) and AS Layer structure 250 taken along "Cut B" of circuit 210 shown in FIG. 3. In FIG. 4B, there is depicted conductive connections between arming switch element 250 to an access point, e.g., access point 260 for eventual connection outside the chip for receiving a power signal used to arm the switch 250.

In one embodiment, conductive structures are provided to electrically connect Arming Switch activation material layer (heater) 252 to access point 260 through at least one metal interconnect structure M1 390. The conductive path to the M1 metal interconnect structure include conductive via structure 360, contact structure 350, poly-Silicon region 304C and to the interlevel metal layer through additional contact structure 370 and conductive via 380. Although not shown, similar conductive structures are provided to electrically connect Arming Switch activation material layer 252 to the other access point 270 through further metal interconnect structures.

FIG. 4B further shows the conductive path to interconnect structure connecting Arming Switch material layer 254 to the RM erasure element 214 via conductive structure 340A, contact structure 310A, poly-Silicon region 304A and through further metal interconnect structures (not shown) that connect to the RM erasure element as described with respect to the Cut A view of FIG. 3.

With reference to the cross-sectional elevational view of FIG. 4B, the connection of the arming switch circuit 210 to access points 260, 270, is performed in step with building of the phase change memory cell array and reactive material erasure devices. In the embodiment shown in the view of FIG. 4A, using known semiconductor processing and lithography steps, the arming switch 250 is built upon an insulative layer, e.g., an oxide such as a formed buried oxide layer (BOX) substrate structure, or built on top a shallow trench isolation layer (STI) such as STI layer structure 303 embedded in a semiconductor substrate in order to isolate adjacent access transistors (not shown). Layer 303 may be the same as and/or is formed during the same process steps as described in forming layer 302 described with respect to the Cut A view.

Formed on top of the STI layer 302 on a semiconductor substrate is the ILD 320, for example, silicon oxide, organosilicate glass or borophophosilicate glass. The ILD layer 320 can be formed by utilizing a deposition process such as, for example, chemical vapor deposition (CVD), physical vapor deposition (PVD) or spin-on coating.

Portions of the ILD layer are removed and lithographic semiconductor manufacturing processes are implemented to form respective conductive structures 304C directly over the STI layer 303 and located at one end of the arming switch 250 for connection to a succeeding metal interconnect level. Bottom conductive poly-Si contact structure 304C provides respective electrical communication from heater element 252 to the access point through metal interconnect M1.

Bottom contact structures 350, 370 are then formed in the ILD layer 320 by forming contact openings (not shown) extending through the ILD layer 320 and filling the contact openings with a conductive material such as, for example, tungsten (W), titanium nitride (TiN) or copper (Cu). In some embodiments of the present application, before filling the contact openings with the conductive material, a contact liner (not shown) may be formed on exposed surfaces of each contact opening. In one embodiment, the contact liner includes TiN. In some embodiments of the present application and when the contact structures are formed of W, respective conductive caps, e.g., of TiN material, may also be formed on top of the bottom contact structures 350, 370 respectively, by recessing the conductive material deposited in the contact openings to provide voids and filling the voids with TiN. The bottom contact structures 350, 370 extend through the ILD layer 20 and both contact Silicided poly-Si regions 304C.

Next, the insulator layer 330 is formed over the bottom contact structures 310A, 310B and the ILD layer 320 including a dielectric material such as silicon oxide, silicon nitride, silicon oxynitride, or a combination thereof in the same process steps as in the Cut A view FIG. 4A.

Then, formed a top of the insulator layer 330 is the further interlevel dielectric layer (ILD) 322, e.g., a low-k dielectric material such as, for example, silicon oxide, organosilicate glass or borophophosilicate glass.

Then, in the same processing steps for forming the conductive via columns 340A and 340B, two spaced-apart interconnect conductive via structures 360, 380 are also formed in the ILD layer 322 that extend through the insulating layer 330 to electrically contact respective contact structures 350, 370 respectively. In one embodiment, contact openings (not shown) are formed to extend through the ILD layer 322 and through the insulating layer 330, and these contact openings are filled with a conductive material such as, for example, tungsten (W), titanium nitride (TiN) or copper (Cu). In some embodiments of the present application, before filling the contact openings with the conductive material, a contact liner (not shown) may be formed on exposed surfaces of each contact opening.

Further process steps including semiconductor lift-off and damascene processes may be used to form the metal interconnect M1 which connects to further interlevel metal interconnections and eventually forming a conductive access point 260 to receive a signal for use when arming the switch 250.

In the view of FIG. 4B, the arming switch 250 is formed in the manner as described herein with respect to FIG. 4A where the arming switch (heater) layer 254 directly contacts an upper surface of the exposed via conductor 340A. In one embodiment, as shown in FIG. 4B, after forming insulator layer 263, the arming switch activation layer 252 is formed using semiconductor material lift-off processing or damascene process techniques to encapsulate the arming switch layer 254 and insulating layer 263 and spacers 261A, 261B on either side edge of the switch 250 as shown by extended portions 252A, 252B. One extended arming switch activation layer portion, e.g., 252B, is formed to directly contact an upper surface of the conductive via 360 which upper surface had been exposed and is co-planar with the upper surface of the IDL 322.

As shown from the Cut B view of FIG. 4B, insulating layer portion 267 formed over the whole length of the formed switch structure 250 comprising the stack including: arming switch layer 254, insulator material layer 263 and side insulating spacers 261A, 261B, and a top switch activation layer structure 252 including extended switch activation layer structure portions 252A, 252B.

In one embodiment, further interlevel dielectric layer 324 may be formed atop the arming switch 250, with further electrical connections in the form of metal layers, e.g., M1 to back end of line structures, and eventually, to connections outside the chip.

Initially, the Ge, Si or phase change material comprising the arming switch structure 254 is in a high resistance/amorphous state. To place arming switch circuitry 210 in an activated (low resistance) state, a suitable amount of electromotive or electrical power is provided at outside pin connections to respective access point conductors 260, 270 shown in FIG. 3 to heat the arming switch activation material layer 252 and place the arming switch material layer 254 in a low resistance state. In one embodiment, the temperature required to arm the switch element by placing it in a decreased resistance state must be higher than the temperature used in the typical processing for manufacturing the IC, e.g., BEOL processes for forming metal level interconnects, that the circuit may be subject to.

Once in this disarmed state, a trigger signal may be easily conducted from the tamper detection unit to the RM material to cause an exothermic reaction thereat and erase phase change memory content at the PCM cells. That is, the reactive material erasure element is situated sufficiently close to the adjacent PCM cells/cell array to allow sufficient delivery of heat generated from the reaction of the reactive material to the PCM cells, which in turn causes the phase transformation of the phase change material. The state change of the phase change material leads to irreversible erasure of any data stored in the PCM cells.

In one embodiment, for example, the RM erasure element 214 may include a multilayer metal stack that causes an exothermic reaction when triggered by a current pulse generated by the triggering voltage source. In one embodiment, the RM erasure element 214 includes Al/Pd, Ni/Al, Cu/Pd, Si/Cr, $SiO_2$/Al or couples included in Table 2 of S. H. Fischer and M. C. Grubelich, presented at the 1996 32 nm AIAA/ASME/SAE/ASEE Joint Propulsion Conference incorporated by reference as if fully set forth herein.

In particular, a sensor device of the tamper detection unit may set off a trigger signal, e.g., when the device is tampered with. The current for triggering the reactive material element 214 can come from a photo voltaic cell, e.g. a phototransistor, a battery, charged capacitors, etc. A high density current flows through the activated (armed) arming switch layer 254 then into the reactive material (through the small contact) shown in FIGS. 4A, 4B. In general, the input for the trigger to the arming switch can be any device able to generate a voltage drop and to supply sufficient current to trigger the reactive material.

In one embodiment, the logic element 24 (e.g., a processor) that is electrically coupled to the PCM periphery circuitry 16 and the RM circuitry 18 and/or tamper device 20 may be further configured to perform an algorithm to determine conditions for triggering the reaction of the reactive material based on a multitude of inputs including inputs related to date and time, inputs related to environment such as, for example, temperature, humidity, pressure and precipitation, inputs related transportation such as, for example, altitude, velocity, acceleration and direction and inputs related to the electromagnetic spectra such as, for example, visible light infrared light and x-rays.

Referring to FIG. 3, with respect to the triggering mechanism of the tamper detection unit 20, a sensor device 25 in the unit may be configured to generate the trigger signal 30. Some examples of sensor units include, but are not limited to: a photo voltaic cell such as a photodiode or phototransistor (for triggering in reaction to a light stimulus), an accelerometer (for triggering in reaction to an applied force/shock), a bio monitoring sensor (for triggering in reaction to a detection or non-detection of a pulse or a particular pulse rate), and a date/time (for triggering in reaction to an elapsed time period such as indicated by a counter).

In a first example, if the package that houses the activation switch circuit 210 is breeched and light impinges on the photo voltaic cell, e.g., a visible light or infrared light, the trigger voltage generated induces a current which flows through the armed (low resistance) arming switch layer 254 and into the reactive material causing the exothermic reaction to occur.

In a second example, if there is a force/shock beyond a specified value an accelerometer allows a current to flow through the armed (low resistance) arming switch layer 254 and into the reactive material causing the exothermic reaction to occur.

As a third example, if a sensor no longer senses a regular human pulse, a current may flow through the armed (low resistance) arming switch layer 254 into the reactive material causing the exothermic reaction to occur.

In a further example, various sensor inputs may be used. For example, if it is a specific month, e.g., December, and any time from noon to midnight, and an accelerometer senses a force above 2G and a biosensor no longer senses a regular human pulse, then current flows into the reactive material causing the exothermic reaction to occur.

In further embodiments, there may be a multiplicity of arming switches which are connected to multiple reactive material elements (not shown) plus phase change memory array units. Different arming switches could be activated into different resistance states, which would then arm each reactive material to various degrees of resistances. Likewise, various trigger inputs may be applied to the different arming switches.

An embodiment having multiple formed Arming Switch devices (and associated triggering circuitry) connected to any given reactive material device may be useful in preventing one from easily defeating a chip anti-tamper system.

In a further embodiment, a fuse that prevents current flow could be connected in series with the arming switch until a deactivation or disarming signal is received. Alternatively, an anti-fuse (arming switch) may also be formed and used to shunt the trigger input current from the arming switch for deactivation.

While the application has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the application is intended to encompass all such alternatives, modifications and variations which fall within the scope and spirit of the application and the following claims.

What is claimed is:

1. A semiconductor device comprising:
    a first layer of material responsive to a thermal condition for changing an electrical resistance property thereof;
    a second layer of material configured to receive a signal applied for generating said thermal condition for changing the electrical resistance property of the first layer of material; and
    an insulator material layer formed between said first and second layers, said first layer of material configured to switch from a first high resistance state to a second low resistive state responsive to said applied signal,
    said semiconductor device embedded in an array of phase change memory cells and a reactive material erasure element situated in proximity to phase change memory cell array structures and configured to generate heat through a spontaneously exothermic reaction, said device further comprising:
    a tamper detection device responsive to a one or more conditions for generating a trigger signal for receipt at said reactive material erasure element;
    said trigger signal being conducted via said first layer of material when in said second low resistive state and sufficient to generate said heat at said reactive material erasure element to induce phase transformation of a phase change material of said phase change memory cells.

2. The semiconductor device of claim 1, said device formed in an integrated circuit and further comprising:
    a first conductive path connecting said second layer of material at a first location to a first interlevel conductor in the integrated circuit; and
    a second conductive path connecting said second layer of material at a second location to a second interlevel conductor in the integrated circuit; said first and second locations at or near opposite ends of said second layer of material,
    wherein said first conductive path and second conductive path receive said applied signal from a signal source external to said integrated circuit.

3. The semiconductor device of claim 2, further comprising:
    a third conductive path connecting said first layer of material at a first location to an electrical contact connecting to said reactive material erasure element; and
    a conductive path connecting said first layer of material at a second location to an electrical contact connecting to a conductor at said tamper detection device for use in conducting said trigger signal therefrom.

4. The semiconductor device of claim 1, wherein said second layer of material comprises a material having a melting point is greater than 2000° C. and resistivity greater than 10 mΩ-cm.

5. The semiconductor device of claim 1, wherein said second layer of material comprises W, TaN, TiN, $MoSi_2$, or PCT ceramics.

6. The semiconductor device of claim 1, wherein said second layer of material comprises Ni—Cr alloys, Fe—Cr—Al alloys, and Cu—Ni alloys.

7. The semiconductor device of claim 1, wherein said first layer of material comprises Ge, Si, or phase change materials, the phase change materials being one of $Ge_xTe_{1-x}$ or $Ge_xSb_yTe_z$, where x>0.6 and 0.2>x>0.5, 0.15>y>0.25, 0.3>z>0.6.

8. The semiconductor device of claim 1, wherein said change in resistance between said first state and said second state is up to four orders of magnitude difference.

9. The semiconductor device of claim 1, wherein said first layer of material and said insulator material layer has a defined width and length, said device further comprising:
    a first insulating spacer element formed adjacent a first lengthwise side edge of the first layer of material and contacting the insulator material layer formed atop said first layer of material;
    a second insulating spacer element formed adjacent a second lengthwise side edge of the first layer of material and contacting the insulator material layer formed atop said first layer of material;
    the second layer of material overlying said insulator material layer and includes first and second layer material portions overlaying respective said first and second spacer elements and is electrically isolated from said first layer of material, and
    said insulator layer of a thickness sufficient to ensure any heat generated by the overlying second layer of material directly transfers to the first layer of material.

10. A memory device comprising:
    an array of phase change memory (PCM) cells arranged in rows and columns, wherein each of the PCM cells comprises a phase change material; and
    a reactive material (RM) erasure element, wherein the RM erasure element is disposed between a pair of adjacent columns of the PCM cells in proximity therewith;
    a tamper detection device responsive to one or more conditions for generating a trigger signal for receipt at said reactive material erasure element; and
    a semiconductor arming switch device, the arming switch device electrically coupling said tamper detection device to said reactive material erasure element.

11. The memory device of claim 10, wherein said arming switch device comprises:
    a first layer of material responsive to conditions for changing an electrical resistance property thereof;
    a second layer of material configured to receive a signal applied for changing the electrical resistance property of the first layer of material; and
    an insulator material layer formed between said first and second layers, said first layer of material configured to switch from a first high resistance state to a second low resistive state responsive to said applied signal,
    wherein said trigger signal is being conducted via said first layer of material when in said second low resistive state and sufficient to generate heat at said reactive material erasure element to induce phase transformation of the phase change material of said phase change memory cells.

12. The memory device of claim 11, said device formed in an integrated circuit and further comprising:
a first electrode providing a conductive path connecting said second layer of material at a first location to a first interlevel conductor; and
a second electrode providing a conductive path connecting said second layer of material at a second location to a second interlevel conductor; said first and second locations at or near opposite ends of said second layer of material,
wherein said first and second interlevel conductors provide access for receiving said applied signal from a signal source external to said integrated circuit.

13. The memory device of claim 12, further comprising:
a third electrode providing a conductive path connecting said first layer of material at a first location to an electrical contact connecting to said reactive material erasure element; and
a fourth electrode providing a conductive path connecting said first layer of material at a second location to an electrical contact connecting to a conductor at said tamper detection device for conducting said trigger signal therefrom.

14. The memory device of claim 11, wherein said second layer of material comprises W, TaN, TiN, $MoSi_2$, or PCT ceramics.

15. The memory device of claim 11, wherein said second layer of material comprises Ni—Cr alloys, Fe—Cr—Al alloys, and Cu—Ni alloys.

16. The memory device of claim 11, wherein said first layer of material comprises Ge, Si, or phase change materials, the phase change materials being one of $Ge_xTe_{1-x}$ or $Ge_xSb_yTe_z$, where $x>0.6$ and $0.2>x>0.5$, $0.15>y>0.25$, $0.3>z>0.6$.

17. The memory device of claim 11, wherein said first layer of material and said insulator material layer has a defined width and length, said device further comprising:
a first insulating spacer element formed adjacent a first lengthwise side edge of the first layer of material and contacting the insulator material layer formed atop said first layer of material;
a second insulating spacer element formed adjacent an opposite lengthwise side edge of the first layer of material and contacting the insulator material layer formed atop said first layer of material;
the second layer of material overlying said insulator material layer and includes first and second layer material portions overlaying respective said first and second spacer elements and is electrically isolated from said first layer of material, and
said insulator layer of a thickness sufficient to ensure any heat generated by the overlying second layer of material directly transfers to the first material layer.

18. A method of operating a integrated circuit having an array of phase change memory (PCM) cells arranged in rows and columns, wherein each of the PCM cells comprises a phase change material element, and having a reactive material (RM) erasure element, wherein the RM erasure element is disposed between a pair of adjacent columns of the PCM cells in proximity therewith, said method comprising:
preventing, during manufacture of said integrated circuit, a signal to be conducted via a semiconductor arming switch device connected to the RM erasure element, the arming switch device disposed to electrically couple a tamper detection device to said reactive material erasure element, said arming switch device comprising:
a first layer of material responsive to conditions for changing an electrical resistance property thereof;
a second layer of material configured to receive a signal applied for changing the electrical resistance property of the first layer of material; and
an insulator material layer formed between said first and second layers, said first layer of material configured to switch from a first high resistance state to a second low resistive state responsive to said applied signal; and said method further comprising:
subsequent to completing packaging of said integrated circuit (IC),
applying, from a signal source external to said IC, a signal through a conductive path connecting said second layer of material at a first location, and connecting said second layer of material at a second location, wherein said applying renders said first layer of material of said arming switch device in a state configured for conducting a signal from the tamper detection device directly to said reactive material erasure element.

19. The method of claim 18, wherein said first location of said second layer of material is proximate one end of said arming switch device and the second location of said second layer of material is proximate an opposite end of said second layer of material.

* * * * *